US006534792B1

(12) United States Patent
Schaffer

(10) Patent No.: US 6,534,792 B1
(45) Date of Patent: Mar. 18, 2003

(54) MICROELECTRONIC DEVICE STRUCTURE WITH METALLIC INTERLAYER BETWEEN SUBSTRATE AND DIE

(75) Inventor: Christopher P. Schaffer, Long Beach, CA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/573,249

(22) Filed: May 18, 2000

(51) Int. Cl.$^7$ .............................................. H01L 23/373
(52) U.S. Cl. ......................... 257/77; 257/712; 257/720
(58) Field of Search .......................... 257/77, 712, 713, 257/720; 438/105, 106, 118, 119, 121, 122

(56) References Cited

U.S. PATENT DOCUMENTS 5,299,214 A * 3/1994 Nakamura et al. ............. 372/36
5,567,985 A * 10/1996 Iacovangelo et al. ........ 257/701

FOREIGN PATENT DOCUMENTS

| JP | 58-108757 | * | 6/1983 | ................. 257/720 |
| JP | 8-64724 | * | 3/1996 | |
| SE | 98/18302 | * | 4/1998 | ................. 361/704 |

OTHER PUBLICATIONS

Iwase (English translation of JP 58–108757).*
American Institute of Physics Handbook, 2nd edition, 1963, McGraw Hill, New York, pp. 4–66.*
Russell, E. M., Thomson, I.; "Embedded Diamond Heat Sinks for Avalanche Diode"; Proceeding of the IEEE, Aug. 1972; pp. 1014–1015.*

* cited by examiner

Primary Examiner—Olik Chaudhuri
Assistant Examiner—Marcos D. Pizarro-Crespo

(57) ABSTRACT

A microelectronic device structure includes a diamond-containing substrate, and a metallic interlayer affixed to the diamond. The interlayer is made of a metal such as copper, silver, or gold, has a thickness of from about 0.003 inch to about 0.009 inch, and has an upper surface. A microelectronic device die is affixed to the upper surface of the metallic interlayer. The material of construction and thickness of the metallic interlayer are selected such that a coefficient of thermal expansion at the upper surface of the metallic interlayer is greater than a coefficient of thermal expansion of the die of the microelectronic device by up to about 3 parts per million per degree Centigrade.

11 Claims, 2 Drawing Sheets

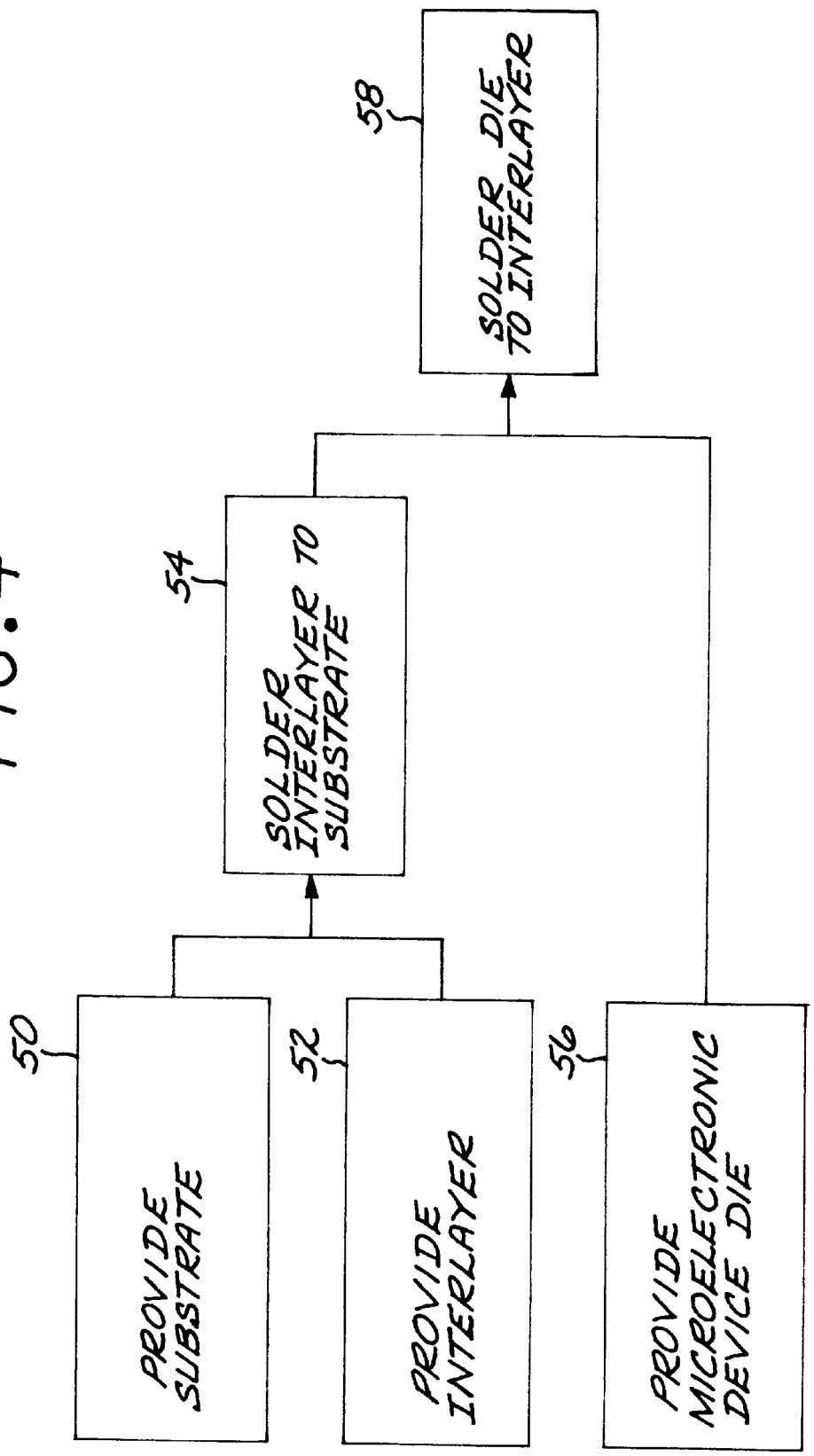

MICROELECTRONIC DEVICE STRUCTURE WITH METALLIC INTERLAYER BETWEEN SUBSTRATE AND DIE

This invention was made with government support under contract MDA972-96-C-0018 awarded by DARPA. The government has certain rights in this invention.

This invention relates to a microelectronic device structure in which a microelectronic device die is supported on a substrate, and, more particularly, to the reduction of thermal stress between the substrate and the die while achieving high heat removal from the die through the substrate.

BACKGROUND OF THE INVENTION

A microelectronic device typically has a large number of active and passive circuit elements formed in a semiconductor material, the unitary structure being termed a die or chip. The die is small in size and relatively fragile. It is therefore affixed to and supported on a substrate, which includes a base and, optionally, a cover. The substrate physically supports and protects the die, and also provides the points of electrical interconnection to the circuit elements on the die. The substrate also provides a heat flow path for removal of heat from the die.

In many applications, the resulting microelectronic device structure experiences temperature changes during operation. One source of temperature change is the environment of the microelectronic device structure. Another source is heat generated by the circuit elements on the die.

The thermal expansion coefficients of the substrate and the die are typically different. Thermal strains result when the temperature is changed. The thermal strains in turn produce thermal stresses between the substrate and the die, which may cause the die to strain and eventually crack. To reduce the thermal stresses produced in the die, it has been common practice to join the die to the substrate with a deformable plastic or adhesive material. The plastic or adhesive deforms to accommodate the thermal strains, so that the thermal stresses in the die are greatly reduced as compared with an approach wherein the die is soldered to the substrate with a metal.

However, the thermal conductivity of typical plastics and adhesives is much lower than metals. The use of the plastics or adhesives to join the die to the substrate therefore results in a diminished capability to remove heat from the die into the substrate. Metal-filled adhesives and plastics with increased thermal conductivity have been developed in an attempt to achieve both reduction of thermal stresses and improved thermal conduction through the joint between the die and the substrate, but their thermal conductivities still fall far short of those of metals.

Recent innovations in substrate materials have produced substantial increases in the ability of the substrate to diffuse heat. For example, diamond has a high thermal conductivity and the ability to remove heat, and it has been found practical to use industrial CVD (chemical vapor deposited) diamond in some substrate applications. With these improvements in substrate design, the interface between the die and the substrate has taken on even greater significance. There is a need for an improved approach for affixing the die of the microelectronic device to the substrate, which achieves both an acceptable state of stress in the die and also accomplishes rapid heat removal from the die to the substrate. The present invention fulfills this need, and further provides related advantages.

SUMMARY OF THE INVENTION

The present invention provides a microelectronic device structure in which a microelectronic device die is attached to a substrate. The approach for attaching the die to the substrate results in a favorable stress state in the die at all temperatures typically encountered during manufacturing and service. Heat flows rapidly from the die to the substrate, which aids in maintaining the die within its operating temperature range. The approach is operable with a wide variety of substrates and dies, and in particular is operable with substrates having diamond to which a gallium arsenide die is attached.

In accordance with the invention, a microelectronic device structure comprises a substrate, and a metallic interlayer affixed to the substrate and having an upper surface. A microelectronic device is affixed to the upper surface of the metallic interlayer.

In a preferred application, the substrate, such as a metallic header, comprises diamond, and the metallic interlayer is affixed to the diamond. The metallic interlayer is made of a metal preferably selected from the group consisting of copper, silver, and gold, most preferably a metal selected from the group consisting of unalloyed copper, unalloyed silver, and unalloyed gold. The metallic interlayer preferably has a thickness of from about 0.003 inch to about 0.009 inch. The die is preferably made of gallium arsenide, silicon, germanium, silicon-germanium, or indium phosphide, although it is not so limited. In one construction, a first solder layer is positioned between the substrate and the metallic interlayer, and a second solder layer is positioned between the metallic interlayer and the microelectronic device.

The use of the metallic interlayer results in good heat transfer from the die to the substrate. To reduce the thermal stresses in the die, and most preferably to place the die in a slight compressive state, the material of construction and thickness of the metallic interlayer are selected such that a coefficient of thermal expansion at the upper surface of the metallic interlayer is the same as, or more preferably, greater than a coefficient of thermal expansion of the die. It is most preferred that the coefficient of thermal expansion at the upper surface of the metallic interlayer is greater than a coefficient of thermal expansion of the die by an amount not exceeding about 3 parts per million per degree Centigrade (ppm/° C.). The result of this preferred thermal design is that the stresses in the die are controlled to be slightly compressive. The fragile semiconductor material of the die is able to bear such compressive loads without failure. For example, where the die is gallium arsenide having a coefficient of thermal expansion of about 6 parts per million per degree Centigrade, the material of construction and thickness of the interlayer are selected so that the coefficient of thermal expansion of the upper surface of the interlayer is from about 6 to about 8 parts per million per degree Centigrade.

To prepare the microelectronic device structure, the substrate, the metallic interlayer, and the microelectronic device die are provided. The metallic interlayer is affixed to the substrate, and the microelectronic device die is affixed to the interlayer. Most preferably, the step of affixing the metallic interlayer to the substrate includes the step of soldering the metallic interlayer to the substrate at a first soldering temperature using a first soldering alloy having a first-soldering alloy melting temperature less than the first soldering temperature. The step of affixing the microelectronic device die to the interlayer is performed after the step of affixing the metallic interlayer to the substrate. The step of affixing the microelectronic device die to the interlayer includes soldering the microelectronic device die to the metallic interlayer at a second soldering temperature that is less than the first-soldering alloy melting temperature, where the second soldering alloy has a second-soldering alloy melting temperature of less than the second soldering temperature.

During this preparation process, the die is affixed to the interlayer with a zero internal stress at elevated temperature. Upon cooling, the interlayer contracts slightly more than the die, placing the die in a slight compressive stress state. The microelectronic device structure is not heated as high as the soldering temperatures during service (or it would structurally fail), so that the die remains in a slight compressive stress state during service and does not fail by tensile loading and cracking.

The heat flow path from the die to the substrate is through the interlayer and the solder materials, which are all metals and have relatively high thermal conductivities. The careful selection of the material of construction and dimension of the interlayer keeps the stress state in the die very low and slightly compressive, minimizing any chance of failure during service. Both excellent heat removal and reduction of the likelihood of thermally induced failure of the die are thereby achieved.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 4 is a block flow diagram of a preferred approach for preparing the microelectronic device structure of FIG. 1.

DETAILED DESCRIPTION OF THE INVENTION

Figure 1:
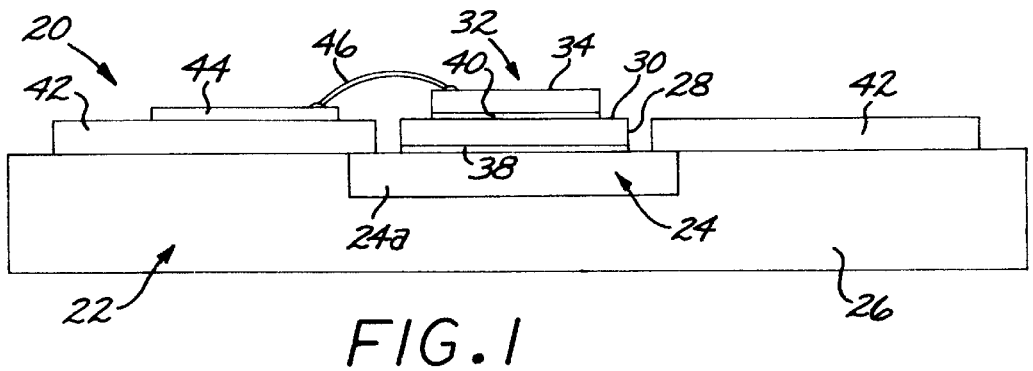
FIG. 1 is a schematic side sectional view of a first embodiment of a microelectronic device structure.
Figure 2:
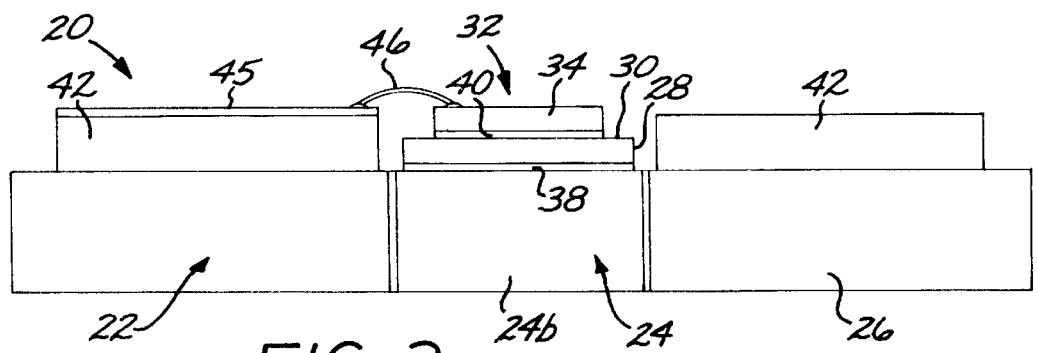
FIG. 2 is a schematic side sectional view of a second embodiment of a microelectronic device structure.
Figure 3:
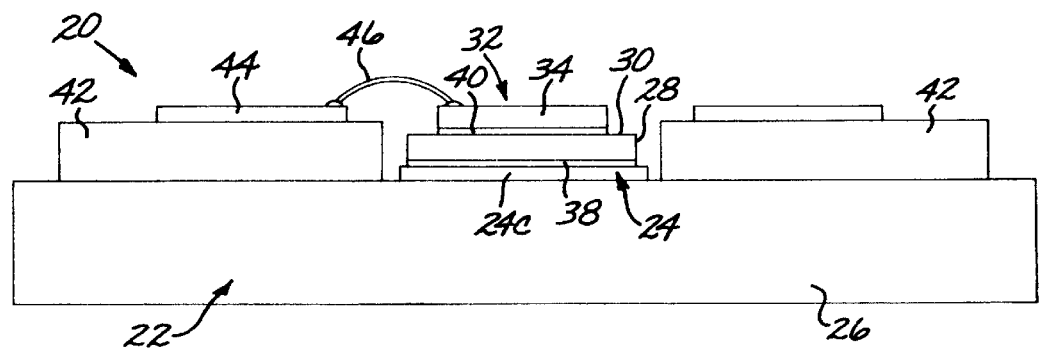
FIG. 3 is a schematic side sectional view of a third embodiment of a microelectronic device structure.

FIGS. 1–3 illustrate three embodiments of a microelectronic device structure 20. The microelectronic device structure 20 includes a substrate 22. The substrate 22 desirably comprises diamond 24, and the three embodiments depict three of the preferred uses of the diamond 24 in the substrate 22. The use of diamond as a heat-dissipating material is not limited to these illustrated embodiments, however. In the embodiment of FIG. 1, a piece of diamond 24a is inset into and affixed to a header 26. In the embodiment of FIG. 2, a piece of diamond 24b is affixed to the header 26, but forms the entire thickness of a portion of the header. In the embodiment of FIG. 3, a thin layer of diamond 24c is affixed to the header 26. The diamond is preferably prepared as a freestanding piece by a technique such as chemical vapor deposition (CVD) and thereafter affixed to the header 26. The diamond may instead, but less preferably, be deposited directly onto the header 26 by a technique such as CVD. The diamond aids in dissipating heat that flows from the overlying structure. The metallic header 26 is preferably made of a composite material of tungsten or silver particles embedded in a matrix of copper, molybdenum, or other operable material.

A metallic interlayer 28 is affixed to the substrate 22, and in particular to the diamond 24. The metallic interlayer 28 is preferably much thinner in its through-thickness dimension as compared to its lateral dimensions. The metallic interlayer 28 has an upper surface 30. For the preferred applications, the metallic interlayer 28 is a metal which has a high thermal conductivity in the through-thickness direction, such as copper, silver, or gold. As used herein, "copper" includes unalloyed copper and copper alloys, "silver" includes unalloyed silver and silver alloys, and "gold" includes unalloyed gold and gold alloys. It is desirable that the thermal conductivity of the interlayer 28 is high, and that the interlayer is of relatively low elastic modulus and is soft and compliant. It is therefore desirable that the copper, when used, be unalloyed copper; that the silver, when used, be unalloyed silver; and that the gold, when used, be unalloyed gold. "Unalloyed" means that the material is free of substantial amounts of alloying elements and is generally as pure as is consistent with cost considerations. Where the removal of heat from the overlying structure is not a consideration, the interlayer 28 may be made of other metals such as tin or iron.

The metallic interlayer 28 is a thin sheet of the metal, and may also be described as a shim. The metallic interlayer 28 is preferably from about 0.003 inch thick to about 0.009 inch thick, for the case where it is affixed to the diamond layer 24. (FIGS. 1–3 are not drawn to scale.) The thinner the metallic interlayer 28, the lower is its thermal impedance. On the other hand, the metallic interlayer 28 is affixed to the substrate 22 and specifically to the diamond 24 in the preferred embodiments. The coefficient of thermal expansion of diamond is about 2 parts per million per degree Centigrade (which may be expressed as $2 \times 10^{-6}$ inches/inch/° C. or 2 ppm/° C.). If the metallic interlayer 28 is too thin, the coefficient of thermal expansion at its upper surface 30 will be dominated by that of the diamond and will be too low to create the stress state to be discussed subsequently. It is found that if the metallic interlayer 28 is less than about 0.003 inches in thickness, the coefficient of thermal expansion at the upper surface 30 is too small. If the metallic interlayer 28 is more than about 0.009 inch in thickness, it tends to deform by edge curling during thermal excursions.

A microelectronic device 32 is affixed to the upper surface 30 of the metallic interlayer 28. The microelectronic device 32 comprises a die 34. The microelectronic circuitry used to process the signals is fabricated in the die. The microelectronic device 32 has a structure and is made by an approach that are known in the art for each particular application. Common die materials are semiconductors such as silicon, gallium arsenide, silicon-germanium, or indium phosphide. A common device substrate material is aluminum oxide. The inventor is interested in applications of the technology to microelectronic devices 32 which process microwave signals, and therefore the die material of most interest is gallium arsenide.

Preferably, the coefficient of thermal expansion at the top surface 30 of the metallic interlayer 28 is equal to or, more preferably slightly larger than, the coefficient of thermal expansion of the die 34. The die 34 is affixed to the top surface 30 of the metallic interlayer 28 at elevated temperature, typically by soldering as described subsequently. When the assembly is cooled, the die 34 is placed into a slight in-plane compressive loading, because the top surface 30 contracts more than the die 34 as they cool. During other fabrication operations and during service, the die 34 will remain in a slight compressive loading state, because its temperature can never be permitted to exceed the joining temperature. Thermal excursions can therefore not cause an in-plane tensile loading on the die 34. The semiconductor material of the die 34 is susceptible to cracking and failure in tensile loading, but is much more tolerant of compressive loadings. The coefficient of thermal expansion of the top surface 30 is preferably not more than about 3 parts per million per degree Centigrade greater than the coefficient of thermal expansion of the die 34, because greater differences can result in excessively high compressive stresses in the die 34 and also on the material used to join the die 34 to the metallic interlayer 28.

Gallium arsenide, which may be used as an example, has a coefficient of thermal expansion of about 6 parts per million per degree Centigrade. When the metallic interlayer 28 is about 0.006–0.008 inches in thickness, the coefficient of thermal expansion at the top surface 30 of the metallic interlayer 28 is about 6–8 parts per million per degree Centigrade, which places the die 34 into a slight compressive loading upon cooling. The preferred thickness of the metallic interlayer 28 for a gallium arsenide die 34 is therefore from about 0.006 inches to about 0.008 inches.

Similar considerations apply to other die materials, such as silicon having a coefficient of thermal expansion of about 4 parts per million per degree Centigrade. The coefficient of thermal expansion at the top surface 30 of the intermetallic interlayer 28 is preferably in the range of from the coefficient of thermal expansion of the die material to about 3 parts per million per degree Centigrade greater than that of the die material.

In the preferred joining approach, the metallic interlayer 28 is joined to the substrate 22 by a first solder layer 38. The die 34 is joined to the metallic interlayer 28 by a second solder layer 40. In the fabrication operation that is preferred, the first solder layer 38 comprises a first soldering alloy having a first-soldering alloy melting temperature, and the second solder layer 40 comprises a second soldering alloy having a second-soldering alloy melting temperature of less than the first-soldering alloy melting temperature. An operable and preferred first solder alloy is an alloy of 88 parts by weight gold and 12 parts by weight germanium, having a first-soldering alloy melting temperature of about 356° C. An operable and preferred second solder alloy is an alloy of 80 parts by weight gold and 20 parts by weight tin, having a second-soldering alloy melting temperature of about 280° C.

In a typical construction of the remainder of the microelectronic device structure 20, a ceramic support layer 42 overlies the substrate 22. Another microelectronic device 44 resides upon the ceramic support layer 42 (as in FIGS. 1 and 3) and/or an electrically conductive trace 45 is deposited upon the ceramic support layer 42 (as in FIG. 2). A wirebond 46 extends between the microelectronic device 44 and/or the trace 45, on the one hand, and the microelectronic device 32. (Typically there are many wirebonds, but only one is shown in each figure to avoid clutter in the drawings.) For some applications, such as devices 32 and 44 operating at microwave frequencies, it is desirable that the wirebond 46 be as short as possible. This end is furthered by making the top surfaces of the devices 32 and 44 and/or the trace 45, to which the wirebond 46 is attached, as nearly coplanar as possible. In this case, the thicknesses of the various layers and structures are cooperatively selected so that the top surfaces of the devices 32 and 44 and/or the trace 45 are substantially coplanar.

FIG. 4 depicts a preferred approach for preparing the microelectronic device structure 20. The substrate 22 is provided, numeral 50, and the interlayer 8 is provided, numeral 52. The interlayer 28 is soldered to the substrate 22 at a first soldering temperature, greater than the first-soldering alloy melting temperature, using the first soldering alloy to form the first solder layer 38, step 54, and then cooled to room temperature. Where the interlayer 28 is soldered to the diamond 24, as is preferred, the diamond 24 is usually metallized prior to soldering to promote the bonding of the solder to the diamond.

The microelectronic device die 34 is provided, numeral 56. In a subsequent operation performed after the step 54 is complete, the microelectronic device die 34 is joined to the interlayer 28 at a second soldering temperature that is greater than the second-soldering alloy melting temperature but less than the first-soldering alloy melting temperature (and thus also less than the first soldering temperature), numeral 58. The die 34 may be metallized to promote the bonding of the solder to the semiconductor material of the die. The first soldering alloy is not melted in this procedure, so that the interlayer 28 remains joined to the substrate 22. The joined assembly is thereafter cooled to room temperature. This two-step soldering approach is selected for manufacturing convenience. A single-step soldering approach, in which both solder layers 38 and 40 are formed in a single operation using a single solder material, may be used instead.

The present invention has been reduced to practice and found fully operable.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A microelectronic device structure, comprising:
    a substrate comprising
        a metallic header, and
        a diamond affixed to the header;
    a metallic interlayer affixed to the diamond, the metallic interlayer having an upper surface;
    a first solder layer between the substrate and the metallic interlayer, the first solder layer having a first-soldering alloy melting temperature;
    a second solder layer between the metallic interlayer and the microelectronic device, the second solder layer having a second-soldering alloy melting temperature, wherein the second-soldering alloy melting temperature is less than the first-soldering alloy melting temperature; and
    a microelectronic device affixed to the upper surface of the metallic interlayer.

2. A microelectronic device structure, comprising:
    a substrate comprising
        a metallic header, and
        a diamond affixed to the header;
    a metallic interlayer affixed to the diamond, the interlayer being made of a metal selected from the group consisting of copper, silver, and gold,
        having a thickness of from about 0.003 inch to about 0.009 inch, and
        having an upper surface; and
    a microelectronic device affixed to the upper surface of the metallic interlayer and comprising a die, wherein the material of construction and thickness of the metallic interlayer are selected such that a coefficient of thermal expansion at the upper surface of the metallic interlayer is greater than a coefficient of thermal expansion of the die of the microelectronic device by up to about 3 parts per million per degree Centigrade.

3. The microelectronic device structure of claim 2, wherein the microelectronic device comprises a die made of a material selected from the group consisting of silicon, gallium arsenide, silicon-germanium, and indium phosphide.

4. The microelectronic device structure of claim 2, further including
   a first solder layer between the diamond and the metallic interlayer.

5. The microelectronic device structure of claim 2, further including
   a second solder layer between the metallic interlayer and the microelectronic device.

6. The microelectronic device structure of claim 2, wherein the diamond comprises a freestanding piece of diamond.

7. The microelectronic device structure of claim 2, wherein the upper surface of the metallic interlayer has a coefficient of thermal expansion of from about 6 to about 8 parts per million per degree Centigrade.

8. The microelectronic device structure of claim 2, further including
   a first solder layer between the substrate and the metallic interlayer, the first solder layer having a first-soldering alloy melting temperature; and
   a second solder layer between the metallic interlayer and the microelectronic device, the second solder layer having a second-soldering alloy melting temperature, wherein the second-soldering alloy melting temperature is less than the first-soldering alloy melting temperature.

9. A microelectronic device structure, comprising:
   a substrate comprising
      a metallic header, and
      a diamond affixed to the header;
   a metallic interlayer affixed to the diamond, the interlayer being made of a metal selected from the group consisting of copper, silver, and gold,
      having a thickness of from about 0.003 inch to about 0.009 inch, and
      having an upper surface;
   a first solder layer between the substrate and the metallic interlayer, the first solder layer having a first-soldering alloy melting temperature;
   a microelectronic device affixed to the upper surface of the metallic interlayer and comprising a die, wherein the material of construction and thickness of the metallic interlayer are selected such that a coefficient of thermal expansion at the upper surface of the metallic interlayer is greater man a coefficient of thermal expansion of the die of the microelectronic device by up to about 3 parts per million per degree Centigrade; and
   a second solder layer between the metallic interlayer and the microelectronic device, the second solder layer having a second-soldering alloy melting temperature, wherein the second-soldering alloy melting temperature is less than the first-soldering alloy melting temperature.

10. The microelectronic device structure of claim 9, wherein the metallic interlayer is made of a metal selected from the group consisting of unalloyed copper, unalloyed silver, and unalloyed gold.

11. The microelectronic device structure of claim 9, wherein the microelectronic device comprises a die made of a material selected from the group consisting of silicon, gallium arsenide, silicon-germanium, and indium phosphide.

* * * * *